US011047885B2

(12) United States Patent
Bohnert et al.

(10) Patent No.: US 11,047,885 B2
(45) Date of Patent: Jun. 29, 2021

(54) SENSOR DEVICE HAVING AN INTEGRATED BEAM SPLITTER (71) Applicant: ABB Power Grids Switzerland AG, Baden (CH)

(72) Inventors: Klaus Bohnert, Oberrohrdorf (CH); Andreas Frank, Zürich (CH); Yang Lin, Widen (CH); Xun Gu, Neuenhof (CH); Georg Müeller, Glattpark (CH)

(73) Assignee: ABB Power Grids Switzerland AG, Baden (CH)

( * ) Notice: Subject to any disclaimer, the term of this patent is extended or adjusted under 35 U.S.C. 154(b) by 191 days.

(21) Appl. No.: 16/253,755

(22) Filed: Jan. 22, 2019

(65) Prior Publication Data

US 2019/0154738 A1    May 23, 2019

Related U.S. Application Data (63) Continuation of application No. PCT/EP2016/067569, filed on Jul. 22, 2016.

(51) Int. Cl.
*G01R 15/24* (2006.01)
*G01R 19/32* (2006.01)

(52) U.S. Cl.
CPC ............ *G01R 15/246* (2013.01); *G01R 19/32* (2013.01)

(58) Field of Classification Search
CPC . G02B 6/12009; G02F 1/2955; G01R 1/0483; G01R 1/06794; G01R 31/2601; G01R 31/2893; G01R 1/071; G01R 31/26; G01R 31/2851; G01R 31/308; G01R 31/311
See application file for complete search history.

(56) References Cited

U.S. PATENT DOCUMENTS 6,208,129 B1 *  3/2001  Willsch ................ G01R 15/247
                                                      324/117 R
6,608,481 B1     8/2003  Piazza et al.
2014/0376000 A1 12/2014  Swanson et al.
2016/0033556 A1  2/2016  Mueller et al.
(Continued)

FOREIGN PATENT DOCUMENTS

CN    101427142 A    5/2009
CN    105301319 A    2/2016
(Continued)

OTHER PUBLICATIONS

Beresna et al., "Ultrafast laser direct writing and nanostructuring in transparent materials," Advances in Optics and Photonics, vol. 6, 2014, pp. 293-339.
(Continued)

Primary Examiner — Tung X Nguyen
(74) Attorney, Agent, or Firm — Sage Patent Group (57) ABSTRACT The optical interferometric sensor device comprises an integrated beam splitter having a first facet and a second facet with optical ports arranged therein. On the beam splitter, the beam splitting junctions as well as the optoelectronics-side ports and the sensing-side port are arranged with a mutual displacement along the direction of the first facet. This displacement reduces undesired interference effects caused by stray light. Also, a quarter-wave retarder is provided in a recess of the beam splitter with layers of soft adhesive adjacent to it in order to reduce stress.

21 Claims, 9 Drawing Sheets (56) References Cited

U.S. PATENT DOCUMENTS

2017/0307687 A1* 10/2017 Grosse .............. G01R 31/2884
2017/0350922 A1* 12/2017 Ergin .................. G01R 15/246

FOREIGN PATENT DOCUMENTS

| WO | 2007121592 A1 | 11/2007 |
| --- | --- | --- |
| WO | 2008080878 A1 | 7/2008 |
| WO | 2014006121 A1 | 1/2014 |
| WO | 2014/154299 A1 | 10/2014 |
| WO | 2015090448 A1 | 6/2015 |
| WO | 2015091972 A1 | 6/2015 |

OTHER PUBLICATIONS

Bohnert et al., "Fiber-Optic Current Sensor for Electrowinning of Metals," Journal of Lightwave Technology, vol. 25, No. 11, Nov. 2007, pp. 3602-3609.
Bohnert et al., "Temperature and Vibration Insensitive Fiber-Optic Current Sensor," Journal of Lightwave Technology, vol. 20, No. 2, Feb. 2002, pp. 267-276.
Forrest et al., "Channel Waveguides in Glass via Silver-Sodium Field-Assisted Ion Exchange," Journal of Lightwave Technology, vol. LT-4, No. 2, Feb. 1986, pp. 140-150.
Frosio et al., "Reciprocal reflection interferometer for a fiber-optic Faraday current sensor," Applied Optics, vol. 33, No. 25, Sep. 1, 1994, pp. 6111-6122.
Han et al., "A High Extinction Ratio Polarization Beam Splitter With MMI Couplers on InP Substrate," IEEE Photonics Technology Letters, vol. 27, No. 7, Apr. 1, 2015, pp. 782-785.
Kurosawa et al., "Flexible Fiber Faraday Effect Current Sensor Using Flint Glass Fiber and Reflection Scheme," IEICE Trans. Electron., vol. E83-C, No. 3, Mar. 2000, pp. 326-330.
Lefevre, H., "The Fiber-Optic Gyroscope," Artech House, Boston, London, 1993, 32 pp.
Oh et al., "Polymer waveguide integrated-optic current transducers," Opt. Express, 2011, vol. 19, No. 10, 9 pp.
Prajzler et al., "Design and Modeling of Symmetric Three Branch Polymer Planar Optical Power Dividers," Radioengineering, vol. 22, No. 1, Apr. 2013, pp. 233-239.
Xu et al., "Proposal for Compact Polarization Splitter Using Asymmetrical Three-Guide Directional Coupler," IEEE Photonics Technology Letters, vol. 27, No. 6, Mar. 15, 2015, pp. 654-657.
Standard of the International Electrotechnical Comission (IEC), IEC60044-8, Instrument transformers—Part 8: Electronic current transformers, 2002, 128 pp.
European Patent Office, International Preliminary Report on Patentability issued in corresponding Application No. PCT/EP2016/067569, dated Jul. 5, 2018, 19 pp.
ABB Schweiz AG, Response to Written Opinion submitted to the European Patent Office dated May 18, 2018, in corresponding Application No. PCT/EP2016/067569, 3 pp.
European Patent Office, International Search Report & Written Opinion issued in corresponding Application No. PCT/EP2016/067569, dated May 8, 2017, 16 pp.
Izutsu, Masayuki et al.; "Operation Mechanism of the Single-Mode Optical-Waveguide Y Junction"; Optic Letters, vol. 7, No. 3; Mar. 1982; 3 pages.
Office Action and Search Report dated Jan. 11, 2021 for Chinese Patent Application No. 2016800878687, 11 pages. (English translation provided).
Zhang, Shufang et al., "Polarizing Maintaining Fiber Grating Sensor Demodulation Method Based on Polarizing Beam Splitters", Instrument Technique and Sensor, vol. 1, Jan. 31, 2014, pp. 11-13 (English Abstract provided).
Li, Xianghua et al., "POTDR Distributed Fiber-optic Intrusion Sensor", Instrument Technique and Sensor, vol. 6, Jun. 30, 2009, pp. 18-20 (English Abstract provided).

* cited by examiner

SENSOR DEVICE HAVING AN INTEGRATED BEAM SPLITTER

FIELD OF THE INVENTION

The invention relates to an optical sensor device having an integrated-optics beam splitter, such as it is e.g. used for high-voltage current and voltage measurements.

BACKGROUND OF THE INVENTION

An important class of optical sensors is based on sending a probing light beam into a sensor head, where two polarization components of the light beam are subject to a phase shift depending on a parameter to be measured (measurand). The polarization components of the returning light are then analyzed for their mutual phase shift.

Some embodiments of fiber-optic current sensors, as one example of such sensors, e.g. for use in high-voltage substations, commonly employ the Faraday effect in an optical fiber [1, 2]. The fiber is coiled in one or several loops around the current conductor. The magnetic field of the current introduces a differential phase shift between left and right circularly polarized light waves propagating through the fiber. There are various techniques for measuring the magneto-optic phase shift. Commonly, high performance current sensors use an interferometric technique based on non-reciprocal phase modulation as also known from fiber gyroscopes [2-4]. The method is sophisticated and requires expensive components, in particular an integrated-optic modulator and a polarization maintaining fiber (PMF). Simpler polarimetric detection schemes use passive optical components, such as combinations of polarizers and waveplates [5, 6] or polarizers and Faraday rotators [7, 8] that convert the magneto-optic phase shift into a change of the transmitted optical power. Here, the wave plates (or rotators) introduce a 90°-phase bias (or, equivalently, a 45°-polarization rotation) between the interfering light waves. The working point of the sensor (phase bias at zero-current) is then in the linear range of the sinusoidal response function of the sensor. Often, such sensors work with two detection channels. The optical power in the two channels varies with opposite phase in response to the applied current. The difference of the two signals divided by their sum is proportional to the current and independent of the source power.

WO2007/121592 discloses a sensor, in which the magneto-optic phase shift is converted into two anti-phase sensor signals by a combination of an integrated-optic beam splitter, a quarter-wave retarder, and polarizer platelets [5].

Figure 1:
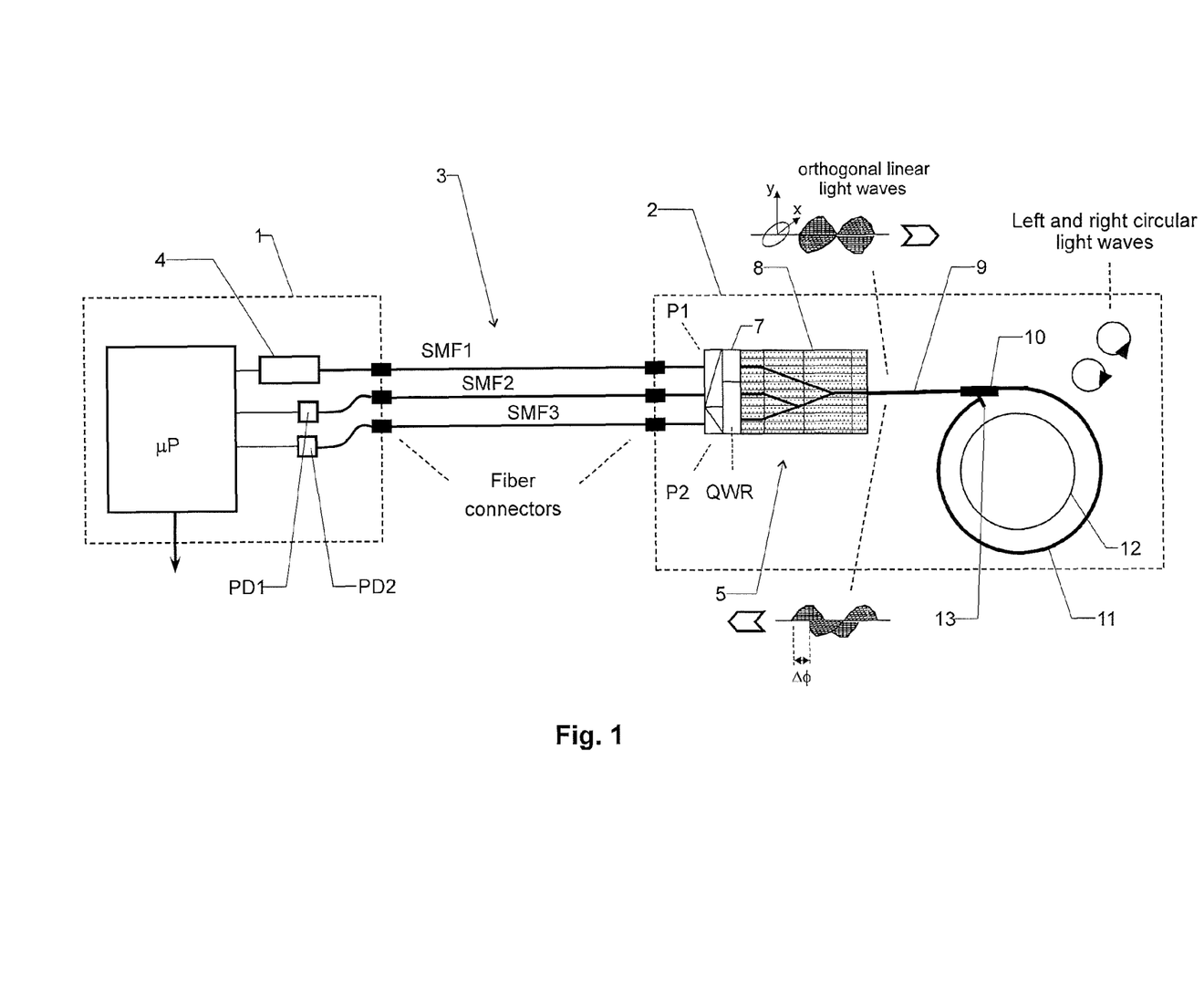
FIG. 1 shows a sensor configuration as described in [6]

WO2015/090448 discloses particular methods of signal processing for such a sensor [6], and FIG. 1 shows a configuration of such a sensor.

The device of FIG. 1 comprises a sensor electronics unit or optoelectronics unit 1 and a sensor head 2 connected by fibers 3. In the sensor electronics unit 1, light from a broad-band light source 4 is depolarized and transmitted via a single-mode optical fiber SMF1 to a 1×3 beam splitter device 5. A polarizer P1 polarizes the light, then the light is transmitted through a spacer 7 from a first facet into a waveguide of an integrated-optics beam splitter 8. Preferably, the polarization direction of polarizer P1 is at 45° with the respect to the normal of the surface of the beam splitter 8.

At an opposite, second facet of beam splitter 8, the light couples into a polarization-maintaining fiber (PMF) pigtail 9. The principal fiber axes are parallel and perpendicular to the normal of the surface of beam splitter 8, i. e. at 45° to the polarization direction of polarizer P1, so that both orthogonal polarization modes of the PMF are excited.

The light from PMF pigtail 9 is fed through a fiber retarder 10 before it enters a sensing fiber 11. The sensing fiber 11 forms a coil around a current conductor 12. The retarder 10 converts the orthogonal linearly polarized light waves exiting from the PMF into left and right circularly polarized waves. The light reflects off a reflective coating, i.e. a reflector 13, at the far end of sensing fiber 12 and then passes the sensing fiber 12 a second time. Upon reflection the polarization states of the two light waves are swapped, i.e. left circular light becomes right circular and vice versa. Retarder 10 converts the reflected circular waves back to orthogonal linear waves. The returning orthogonal waves have a magneto-optic phase shift $\Delta\phi$ as a result of the Faraday-effect (see eq. 3 below).

Within beam splitter 8 the returning light splits into a first and a second detector channel. A quarter-wave retarder plate QWR at the first facet introduces a 90° differential phase delay (phase bias) between the orthogonal waves of both channels. The principal axes of the QWR are aligned parallel to the axes of PMF pigtail 9 and at 45° to polarizer P1. The orthogonal waves of the first channel interfere at polarizer P1 (which is common to the light source channel and detector channel 1). The orthogonal waves of the second channel interfere at a polarizer P2. The polarization direction of polarizer P2 is at 90° to the one of polarizer P1. Then, two single-mode fibers (SMF 2 and SMF 3) typically guide the light of the two channels to photo-detectors PD1 and PD2 in the sensor electronics unit 1.

In practice, it is found that the design of FIG. 1 exhibits a certain degree of temperature dependence and signal instability. Such instability can prevent that the sensor reaches metering class accuracy. Applications in high voltage often require accuracy to within ±0.2% over extended temperature ranges, e.g. from −40° C. to 85° C. [9].

WO 2007/121592 describes a sensor device having an integrated-optics beam splitter.

SUMMARY OF THE INVENTION

Hence, the problem to be solved by the present invention is to provide a device of the type described above that shows improved accuracy.

In a first aspect of the invention, the above problem is solved by an optical sensor device that comprises the following parts:

A light source: This light source generates the light by means of which the measurement is carried out.

A first fiber: The light from the light source is coupled into this first fiber.

An integrated-optics beam splitter: The beam splitter has at least one optoelectronics-side entry port, at least one first and at least one second optoelectronics-side exit port and at least one sensing-side port. Light entering the optoelectronics-side entry port is coupled at least partially into the sensing-side port, and light entering the sensing-side port is split at least partially into the optoelectronics-side exit ports. The first fiber is positioned to send light into the optoelectronics-side entry port.

A sensing element whose (e.g. circular and/or linear) birefringence changes as a function of a measurand: The sensing element is positioned such that light from the sensing-side port of the beam splitter is coupled into the sensing element, reflected and coupled back into the sensing-side port, so that the beam splitter can split it up at least partially between the optoelectronics-side exit ports.

An integrated-optics beam splitter: Light from said first fiber is coupled into an optoelectronics-side entry port of this beam splitter.

At least a second fiber and a third fiber: The light from the first and the second optoelectronics-side exit ports is fed into the second and third fibers, respectively.

Light detectors measuring light exiting from the second and third fibers.

The beam splitter comprises a) a plurality of waveguide sections as well beam splitting junctions arranged in a waveguide plane, and b) a first and a second facet on opposite sides of the beam splitter, wherein the optoelectronics-side entry port and the optoelectronics-side exit ports are arranged at said first facet and the sensing-side port is arranged at said second facet.

Further, in a direction Y parallel to the first facet, said sensing-side port is offset, by a non-zero minimum port-port-offset, with respect to the optoelectronics-side entry port, in particular to all of the optoelectronics-side entry ports, and to the first and second optoelectronics-side exit ports, in particular all of the optoelectronics-side exit ports.

This design is based on the understanding that scattered light is generated at the optoelectronics-side entry port as well as at the sensing-side port, when light enters through any of these ports into the beam splitter. The scattered light tends to propagate as a comparatively narrow light field through the beam splitter towards to opposite facet, where it can re-couple into the signal path, if it arrives at the location of the sensing-side port or one of the optoelectronics-side exit ports. Such re-coupling leads to undesired signal instability and unexpected effects in the measurements. By offsetting the ports as claimed, the recoupling can be avoided.

Furthermore, the sensing-side port is offset, along direction Y, by a non-zero minimum junction-port-offset, in respect to any waveguide junction that the light from the optoelectronics-side entry port passes on its way to the sensing-side port. At these junctions, stray light propagating towards the second facet is generated. By offsetting the sensing-side port in this manner, re-coupling of the scattered light is avoided.

In another advantageous embodiment, said first and second optoelectronics-side exit ports, in particular all of the optoelectronics-side exit ports, are offset, along direction Y, by a non-zero minimum junction-port-offset, in respect to any junction that the light from the sensing-side port passes on its way to any of the optoelectronics-side entry or exit ports. At these junctions, stray light propagating towards the first facet is generated. By offsetting the optoelectronics-side ports in this manner, re-coupling of the scattered light is avoided. Furthermore, recoupling of light scattered from the optoelectronics-side entry port into a junction is avoided, as well.

Advantageously, the sensor devices comprises:

At least a second fiber and a third fiber: The light from the first and the second optoelectronics-side exit ports is fed into the second and third fibers, respectively.

Light detectors measuring light exiting from the second and third fibers.

A quarter-wave retarder: This retarder is arranged between at least one of the fibers and the sensing-side port.

Furthermore, the beam splitter comprises a recess or slit. The quarter-wave retarder is arranged in said recess or slit, respectively. The depth of said recess or width of said slit is larger than the thickness of said quarter-wave retarder, in particular at least 5 μm larger, in order to facilitate the insertion of the retarder. In this context, the terms "thickness", "depth", and "width", describe the extension of the retarder, recess and slit in a direction perpendicular to the first facet of the beam splitter.

This design is based on the understanding that placing the quarter-wave retarder in a recess or slit with room to spare reduces the mechanical strain on the retarder, which in turn reduces unwanted perturbations of the phase delay between the polarization modes.

Advantageously, the input and/or the output side of the quarter-wave retarder is bordering a transparent adhesive layer that fills the voids on one or both sides of the retarder, and the Young's modulus of the adhesive layer is smaller by at least a factor of 10 than the Young's modulus of the quarter-wave retarder. This allows the adhesive layer to yield when the components are subjected to temperature changes, thereby keeping the strain in the retarder small.

Advantageously, the thickness of the adhesive layer is at least 1 μm.

In many configurations, the device will comprise a first and a second polarizer arranged between the fibers and the optoelectronics-side entry port and between the fibers and the optoelectronics-side exit ports of the beam splitter in order to create defined polarizations upon entry in the beam splitter and/or to let the modes of light returning from the sensing element interfere.

In that case, the quarter-wave retarder is advantageously arranged in its recess between at least one of said polarizers and the beam splitter.

The invention is particularly suited to measure a current or voltage. In those cases, the sensing element comprises a magneto-optic component wound around a conductor carrying the current or an electro-optic component arranged in an electrical field generated by the voltage.

The two aspects of the present invention can either be used individually or in combination with each other.

The invention also relates to the use of the sensor device for determining the temperature at the quarter-wave retarder or for correcting the measurand by measuring the difference between normalized signals from said light detectors, wherein said difference is measured in the absence of a phase shift in said sensing element or derived from low-pass filtered values of said signals over several periods of a periodic measurand. The temperature measured in this way can e.g. be used to compensate for temperature effects in the measurement results, i.e. it can be used for correcting the measurand.

In this context, the difference between "normalized" signals is the difference between these signals after an optional scaling of one or both signals in order to compensate e.g. for individual losses in each signal path.

BRIEF DESCRIPTION OF THE FIGURES

The invention will be better understood and objects other than those set forth above will become apparent when consideration is given to the following detailed description thereof. This description makes reference to the annexed drawings, wherein.

DETAILED DESCRIPTION

Shortcomings of Conventional Designs

Figure 2:
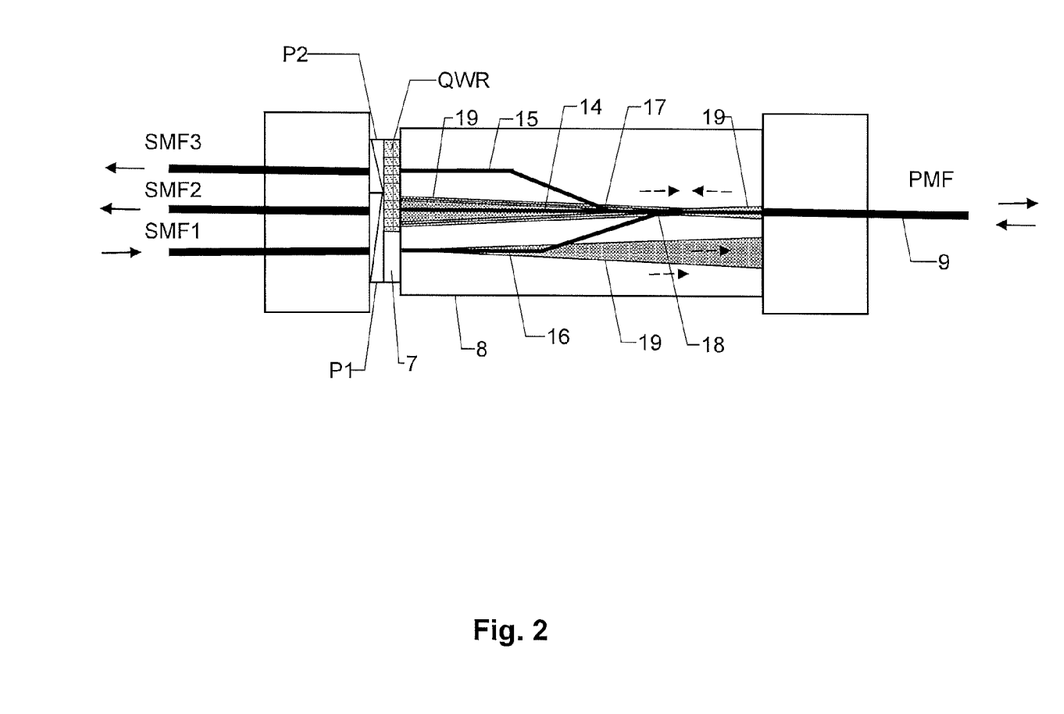
FIG. 2 shows light scattering in a conventional beam splitter.

FIG. 2 shows a polarization splitter for use in a polarimetric current sensor according to [6] (Note: Contrary to what is schematically drawn in FIG. 2 and some of the following figures, the waveguides bend and junctions do not have sharp corners but are actually fabricated with defined curvature). Commonly, the waveguides are fabricated in a glass substrate by electric-field-assisted ion exchange [10]. The basic integrated-optical beam splitter 8 is a 1×3 splitter (often referred to as PLC splitter, planar lightwave guide circuit) supplemented with analyzer optics and fiber pigtails assembled onto the end facets as described above.

In the embodiment in FIG. 2, the central waveguide 14 is essentially a straight connection between the PMF fiber on one facet and the central single-mode fiber (SMF2) on the opposite facet. The two outer waveguides 15, 16 split off from central waveguide 14 at asymmetric waveguide y-junctions 17, 18 [11]. However, a waveguide layout with symmetric y-junctions is also possible as shown in FIG. 1. Preferably, the junctions 17, 18 are designed with splitting ratios such that the optical power coupled into the splitter from the PMF side is split in equal amounts into the three exit channels. The first junction from the right has then a splitting ratio of 1:2, whereas the other junction has a ratio of 1:1.

There is unavoidable optical power loss at each fiber-to-waveguide interface and at the waveguide y-junctions 17, 18. Causes for loss at the fiber-to-waveguide interface are mismatches of the refractive indices and numerical apertures, the gap between the SMFs and the waveguides that is needed for the analyzer optics, as well as possible misalignment. The losses at the junctions are inherent radiation losses [11]. Particularly, while the lightwave from the single-branch end of the y-junction may be split 1:1 into the two branches on the other side with minimal loss, only 50% power of a lightwave in the opposite direction from one of the two branches would be coupled into the waveguide in the single-branch side, with the other half dissipated into the substrate.

The lost light travels as unguided stray light through the splitter chip, essentially parallel to the waveguides. The regions of most intense stray light are shown in FIG. 2 as hatched areas 19.

Small fractions of the stray light can then be coupled into the PMF 9 or the SMFs of the two detector channels or can re-couple into the waveguides at the y-junctions 17, 18 and get mixed with the guided signal light.

The length of the beam splitter 8 may be in the range of about 10 mm. For this dimension, it has been measured that the width of stray light beams at 1310 nm that originate from the SMF facet reaches roughly 100 µm-150 µm at the opposite PMF facet, whereas a typical spacing of the waveguides at the SMF facet is 250 µm. Therefore, the outer fringes of the stray light beam from the source channel (SMF 1) may couple into the PMF, together with radiation from the y-junctions 17, 18. Analogously, stray light from the PMF facet and the y-junctions can couple into the two SMFs of the detector channels (SMF 2, 3). This is particularly true for the SMF of the inner channel (SMF 2).

The phase of stray light that re-couples into the fibers differs from the phase of the light that has travelled through the waveguides, because the effective refractive indices of the waveguides and the substrate differ. Furthermore, both the relative intensity of the recoupled stray light and the phase difference change with temperature. Hence, the stray light modifies the interference intensity in the two detector channels in a temperature-dependent fashion. Since the stray effects have poor reproducibility, they can vary and seriously degrade the accuracy of the sensor. A relative stray light power fraction of only 1 ppm already leads to a peak-to-peak modulation of the interference intensity of 0.4% as a function of the phase difference between the stray light and guided light. It is obvious that the suppression of stray light is essential, if the sensor is to achieve metering class accuracy (typically, the error must be <±0.2% as mentioned further above).

Another disturbing effect adverse to metering accuracy is temperature-dependent stress on the quarter-wave retarder platelet QWR. As a result, the phase bias of the interfering light waves does not only exhibit the temperature dependence of the natural birefringence of the retarder, but also of largely random birefringence caused by stress, again with poor reproducibility.

In the following, modifications of the polarization splitter are disclosed that are to eliminate or reduce the deficiencies discussed above.

Improved Polarization Splitter

Figure 3:
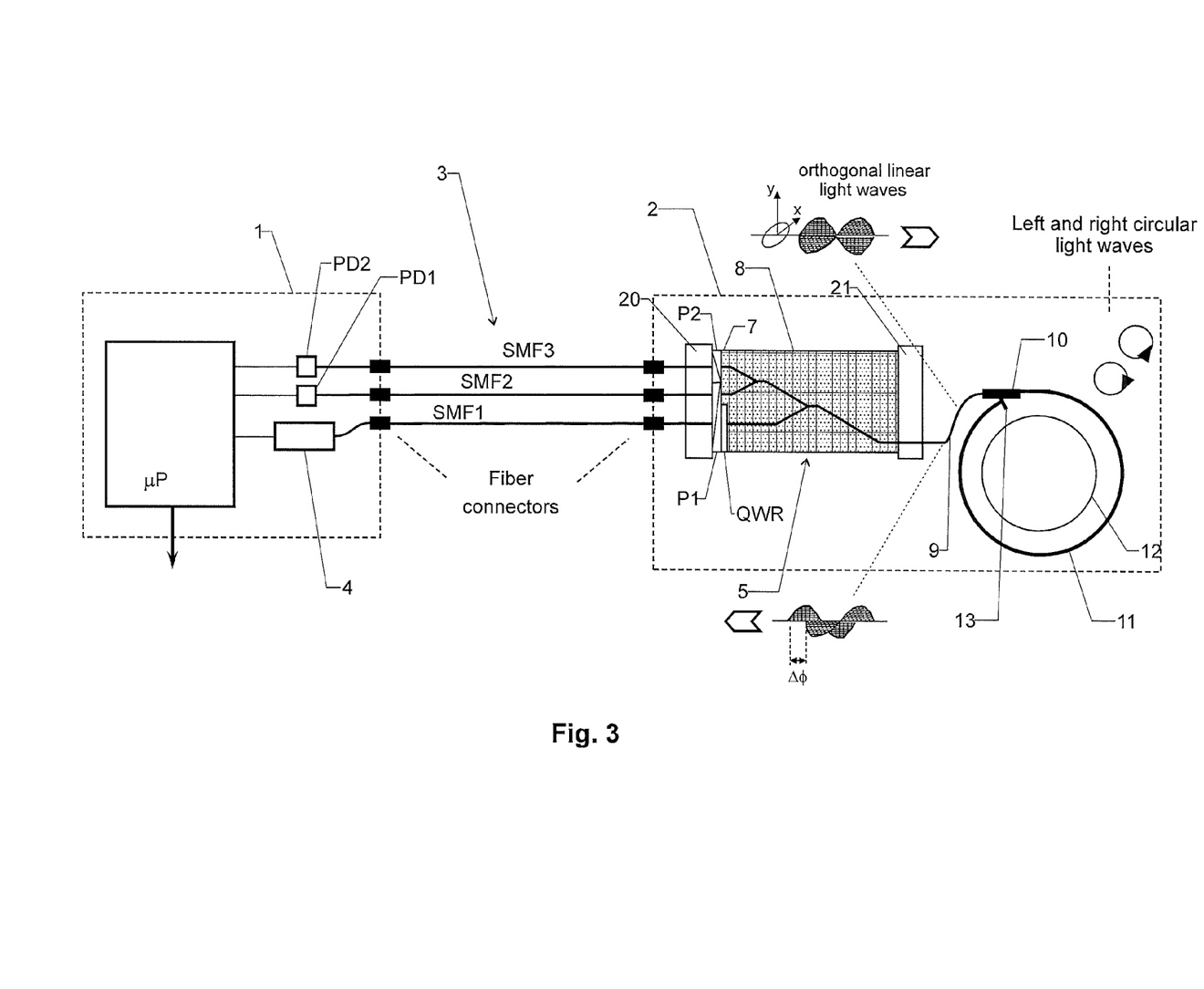
FIG. 3 shows an embodiment of a sensor configuration with improved accuracy.

FIG. 3 shows a sensor similar to the one of FIG. 1. It comprises a sensor electronics unit 1 with a broad-band light source 4, e. g. a superluminescent diode. Its light is depolarized in fiber Lyot depolarizer (not shown) and coupled into a single-mode optical fiber SMF1 for being led to a sensor head 2 comprising a 1×3 beam splitter device 5. At beam splitter device 5, fiber SMF1 is held in a first fiber holder 20 positioned such that the light exiting from SMF1 passes a first polarizer P1 and the quarter wave retarder QWR arranged in a recess on the first facet of an integrated-optics beam splitter 8.

Advantageously, the polarization direction of polarizer P1 is at 45° with the respect to the normal of the surface of beam splitter 8. Then the light is coupled into a waveguide of the beam splitter 8.

At the opposite, second facet of beam splitter 8 the light couples into a polarization-maintaining fiber (PMF) pigtail 9 held in a second fiber holder 21. The principal fiber axes of PMF pigtail 9 are parallel and perpendicular to the normal of the surface of beam splitter 8, i. e. at 45° to the polarization direction of polarizer P1. As a result, both orthogonal polarization-modes of the PM fiber are excited with the same amplitude.

The principal axes of the QWR are aligned parallel to the axes of PMF pigtail 9 and at 45° to polarizer P1.

As in the embodiment of FIG. 1, the light from PMF pigtail 9 is fed through a fiber retarder 10 before the light enters a sensing fiber 11. Sensing fiber 11 forms a coil with an integer number of fiber loops around a conductor 12 carrying the current to be measured. The light reflects back from a reflector 13 at the far end of sensing fiber 12 and then passes the sensing fiber 12 a second time. Upon reflection the polarization states of the two light waves are swapped, i.e. left circular light becomes right circular and vice versa.

Retarder 10 converts the reflected circular waves back to orthogonal linear waves. The polarization directions of the returning linear waves are also swapped compared to the forward propagating waves. The returning orthogonal waves have a magneto-optic phase shift $\Delta\phi$ as a result of the Faraday-effect (see eq. 3 below).

Within beam splitter 8 the returning light splits into a first and a second channel. The orthogonal waves of the first channel interfere at polarizer P1 (which is common to the light source channel and the first channel). The orthogonal waves of the second channel interfere at a polarizer P2. The polarization direction of polarizer P2 is at 90° to the one of polarizer P1.

Two single-mode fibers (SMF2 and SMF3) guide the light of the two channels to photo-detectors PD1 and PD2 in sensor electronics unit 1.

The waveguides of beam splitter 8 are of low birefringence in order not alter the polarization state of the transmitted light. Alternatively, the waveguides are birefringent with the principal axes parallel and perpendicular to the plane of the SC chip (waveguide or beam splitter chip). In the latter case, the birefringent phase retardations of the orthogonal waves on the forward and return paths cancel each other, provided all channels have the same birefringence.

Preferably, the polarizers P1, P2 are thin glass platelets containing oriented metal (e.g. silver) particles or macro-molecules to polarize the light. A typical thickness is e.g. 30 μm. As a result of the small thickness, the coupling losses between the fiber and the beam splitter can be kept small. For the same reason the quarter-wave retarder platelet is a zero-order platelet. The thickness of a corresponding quartz retarder is about 39 μm for a wavelength of 1310 nm.

Typically, the sensing fiber is a low-birefringent fiber or a spun highly birefringent fiber.

Under ideal conditions (perfect angular alignment of the components, no cross-coupling between the two orthogonal polarization modes, no asymmetric optical loss in the two detection channels, sensing fiber free of linear birefringence, fiber retarder with exact quarter-wave retardation) the two detector signals as a function of the magneto-optic phase shift $\Delta\phi$ are given by $$S_1 = (S_o/2)(1+\sin \Delta\phi) \quad (1)$$

$$S_2 = (S_o/2)(1-\sin \Delta\phi) \quad (2)$$

with $$\Delta\phi = 4NVI \quad (3)$$

Here, N, V, I are the number of windings of the fiber coil, the Verdet constant of the sensing fiber (~1 μrad/A at 1310 nm), and the electric current (measurand), respectively. $S_o$ is proportional to the light source power.

The difference of the two signals divided by their sum gives a sensor output signal S, that is independent of the light source power (state of the art):

$$S = (S_1 - S_2)/(S_1 + S_2) \quad (4)$$

$$S = \sin \Delta\phi \quad (5)$$

For $\Delta\phi \ll 1$ (which typically is the case under normal conditions of operation) S varies linearly with $\Delta\phi$:

$$S = \Delta\phi \quad (6)$$

More details on the signal processing have been disclosed in WO2015/090448A1 [6].

Figure 4:
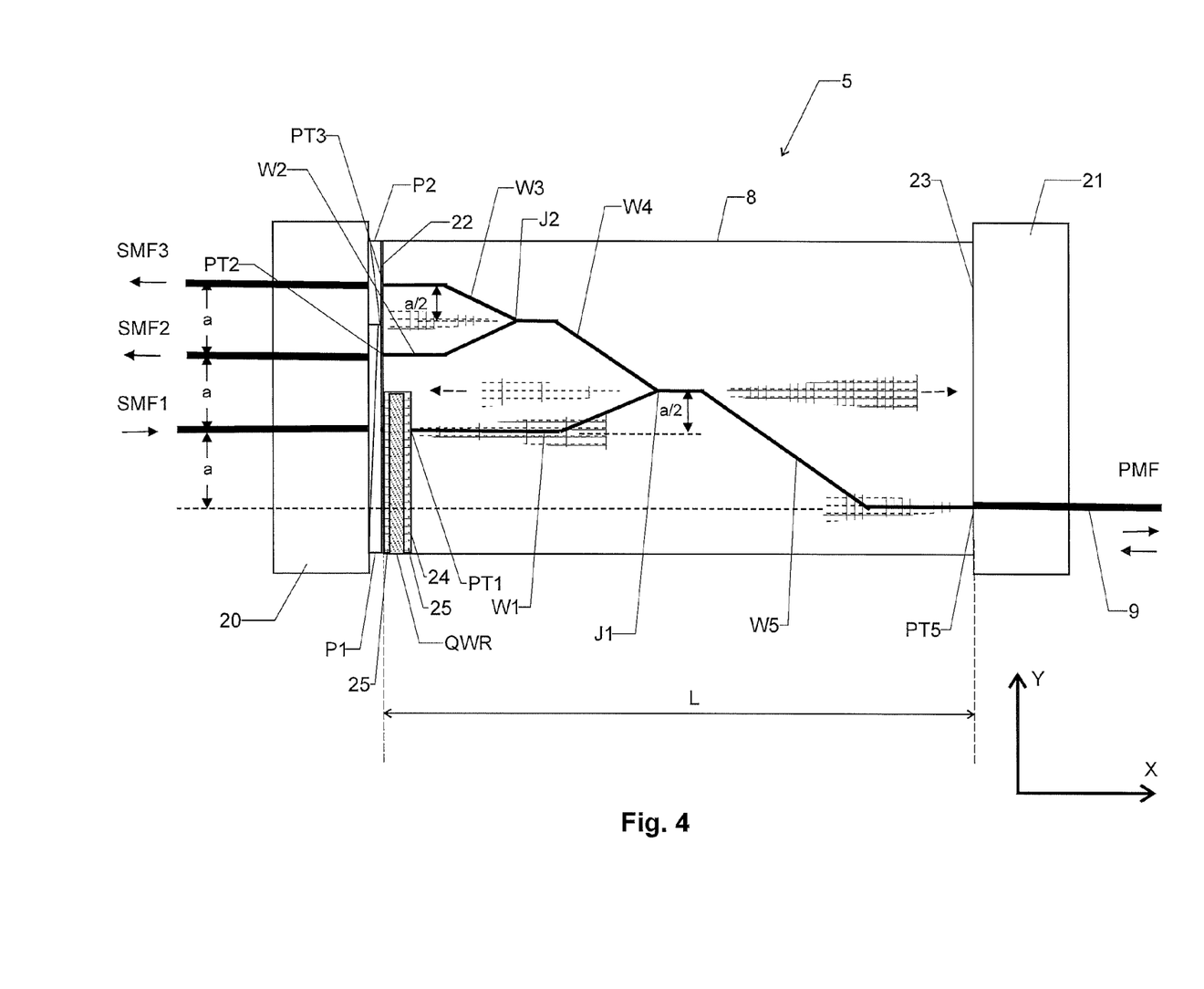
FIG. 4 shows the beam splitter of the embodiment of FIG. 3.

FIG. 4 shows the waveguide layout of the beam splitter 8 of FIG. 3 in more detail. The layout has been modified with the aim to prevent stray light from interfering with guided light. Beam splitter 8 comprises a plurality of waveguide sections W1-W5 arranged in a plane (the waveguide plane), as well as a plurality of beam-splitting junctions J1, J2.

A first waveguide section W1 extends between first facet 22 of beam splitter 8 and first junction J1. A second waveguide section W2 extends between first facet 22 and section junction J2, and a third waveguide section W3 also extends between first facet 22 and second junction J2. A fourth waveguide section W4 extends between first junction J1 and second junction J2. A fifth waveguide section W5 extends between first junction J1 and second facet 23 of beam splitter 8.

First waveguide section W1 is coupled to single mode fiber SMF1, second waveguide section W2 is coupled to single mode fiber SMF2, third waveguide section W3 is coupled to single mode fiber SMF3 and fifth waveguide section W3 is coupled to polarization maintaining fiber PMF.

Beam splitter 8 forms four ports PT1, PT2, PT3 and PT5 where light can enter and/or leave the waveguides. Port PT1 is located where first waveguide section W1 ends at first facet 22. Port PT2 is located where second waveguide section W2 ends at first facet 22. Port PT3 is located where third waveguide section W3 ends at second first facet 22. Port PT5 is located where fifth waveguide section W5 ends at second facet 23.

Port PT1 is also denoted as optoelectronics-side entry port, as it receives light from sensor electronics unit 1 and couples it into beam splitter 8. Ports PT2, PT3 are also called optoelectronics-side exit ports, as they emit light to be sent back to sensor electronics unit 1. Port PT5 is also called the sensing-side port, as it emits and receives light into/from the sensing element formed by the components 10, 12 and 13.

The ports PT1, PT2, PT3 are typically spaced apart by equal distances a, with a denoting the spacing between the grooves of fiber holder 20. Alternatively, if one or more grooves of fiber holder 20 are left empty, the spacing between the ports can be an integer multiple of distance a.

The light from single mode fiber SMF1 enters at port PT1 into first waveguide section W1 and is, in part, coupled into fifth waveguide section W5 to exit at port PT5 into polarization maintaining fiber PMF.

The light returning from polarization maintaining fiber PMF is coupled at port PT5 into fifth waveguide section W5 and split at first junction J1 e.g. by equal parts, into first waveguide section 1 (and therefore optoelectronics-side entry port PT1) and fourth waveguide section 4 (and therefore second junction J2). The light arriving through fourth waveguide section W4 at second junction J2 is split e.g. by equal parts into second waveguide section W2 (and therefore first optoelectronics-side exit port PT2) and third waveguide section W3 (therefore second optoelectronics-side exit port PT3) to be coupled at the optoelectronics-side exit ports PT2 and PT3 into second and third single mode fiber SMF2 and SMF3, respectively.

The locations of the ports and the junctions in beam splitter 8 have been optimized to reduce undesired light coupling. This is explained in the following, with reference to a coordinate system X/Y as shown in FIG. 4. In this system, X denotes the direction between the facets 22 and 23, i.e. the primary direction along which light propagates in beam splitter 8. Y denotes the direction parallel to first facet 22 and parallel to the waveguide plane.

As can be seen, all the waveguide junctions J1, J2 as well as the ports PT1, PT2, PT3, PT5 are mutually displaced along direction Y.

In particular, the sensing-side port PT5 is mutually offset relative to all of the optoelectronics-side ports PT1-PT3 by a non-zero minimum offset. This minimum offset depends on the distance L between the facets 22, 23 and is (for typical apertures of the stray light fields) at least L/20, advantageously at least L/10. A good minimum offset for a typically sized beam splitter 8 is 250 µm, and in particular it can be equal to distance a.

In the present embodiment the waveguide junctions J1, J2 are laterally displaced along Y by a distance a/2 from the ports PT1, PT2, PT3. The straight parts of the waveguide sections W1, W2, W3, i.e. the parts extending parallel to direction X, are themselves mutually separated by distance a. Therefore, light that radiates from the waveguide junctions J1, J2 (as indicated in FIG. 4) is least likely to couple into the SMFs.

In general terms, the sensing-side port PT5 is advantageously in respect to any junction (junction J1 in the embodiment of FIG. 4) that the light from optoelectronics-side entry port PT1 passes on its way to sensing-side port PT5.

Similarly, the used optoelectronics-side exit ports (in the case of FIG. 4, the ports PT2 and PT3) are offset (along y) by a non-zero minimum junction-port-offset from any junction (J1, J2 for FIG. 4) that the light passes from sensing-side port PT5 to any of the used optoelectronics-side ports (PT1-PT3).

This minimum junction-port offset depends on the distance L between the junction and the respective facet. If the largest of said distances is D, the junction-port offset is advantageously at least D/20, advantageously at least D/10. A good minimum offset for a typically sized beam splitter (with L in the order of 10-30 mm) is 125 µm.

The distance a is chosen sufficiently large to reduce the coupling of stray light from the y-junctions J1, J2 into the SMFs to subcritical levels. Advantageously, a should be at least 250 µm.

An advantageous distance is a=500 µm. Another advantageous distance is a=250 µm. A shorter waveguide distance would reduce the achievable splitter chip length.

Advantageously, along direction Y:
First junction J1 is arranged between, advantageously at the center between, optoelectronics-side entry port PT1 and first optoelectronics-side exit port PT2; and/or
Second junction J2 is arranged between, advantageously at a center between, the first and said second optoelectronics-side exit ports PT2, PT3.

Fifth port PT5, and thus the PMF, is laterally displaced from ports PT1, PT2, PT3, in particular from first port PT1, where a large amount of light is scattered into the direction of second facet 23.

Advantageously, fifth port PT5 is displaced along direction y from first port PT1 by a distance a (or more).

Also advantageously, sensing-side port TP5 is displaced along direction y from first junction J1 by a distance a (or more), because a large amount of light is scattered from first junction J1 into the direction of second facet 23.

Also, second and third ports PT2 and PT3 are advantageously displaced along direction y from fifth port PT5 by a distance of at least a, and/or from first junction J1 and/or second junction J2 by at least a/2.

In this way, stray light from the source SMF (SMF 1) and the waveguide junctions is effectively prevented from coupling into the PMF. Vice versa, stray light generated at the transition from the PMF into fifth port PT5 cannot couple into the waveguides at the y-junctions or into the SMFs.

FIG. 4 shows a further modification to prevent stress on the plate of quarter-wave retarder QWR.

First facet 22 of beam splitter 8 is provided with a recess 24, within which quarter-wave retarder QWR is located in a stress-free manner. Recess 22 may have a depth (in direction x) in the range of, e.g., 40 µm to 150 µm, in particular in a range between 45 µm to 100 µm (for comparison, a quartz quarter-wave retarder at 1310 nm has a thickness of 39 µm, as mentioned above). The quarter-wave retarder QWR is fixed in the recess, e.g. by means of a soft adhesive layer 25, such as a soft silicone, acrylate, urethane acrylate, or an adhesive layer with a glass transition temperature below −40° C. Hence, quarter-wave retarder QWR remains free of stress over an extended temperature range, in particular in a range from −40° C. to 85° C. In contrast in conventional devices [5, 6], the retarder is rigidly glued between the fiber holder and the splitter chip and is therefore prone to stress-induced birefringence.

Advantageously, layers of soft adhesive 25 are located on both sides of quarter-wave retarder QWR. The thickness of each layer of adhesive 25 is advantageously at least 1 µm.

Recess 22 with the retarder may be placed into the source channel, i.e. at optoelectronics-side entry port PT1, or into the two detector channels, i.e. at the optoelectronics-side exit ports ports PT2, PT3.

However, the retarder location in the source channel between optoelectronics-side entry port PT1 and the sensing-side junction next to optoelectronics-side entry port PT1, i.e. junction J1 in the embodiment of FIG. 4, is advantageous. In contrast to a location in the two detector channels (see FIG. 2), residual disturbances of the phase bias or cross-coupling between the orthogonal polarization states due to residual stress are then common-mode for both detected signals, i.e. this choice for the retarder position reduces the influence of stress on the final sensor output.

Figure 5:
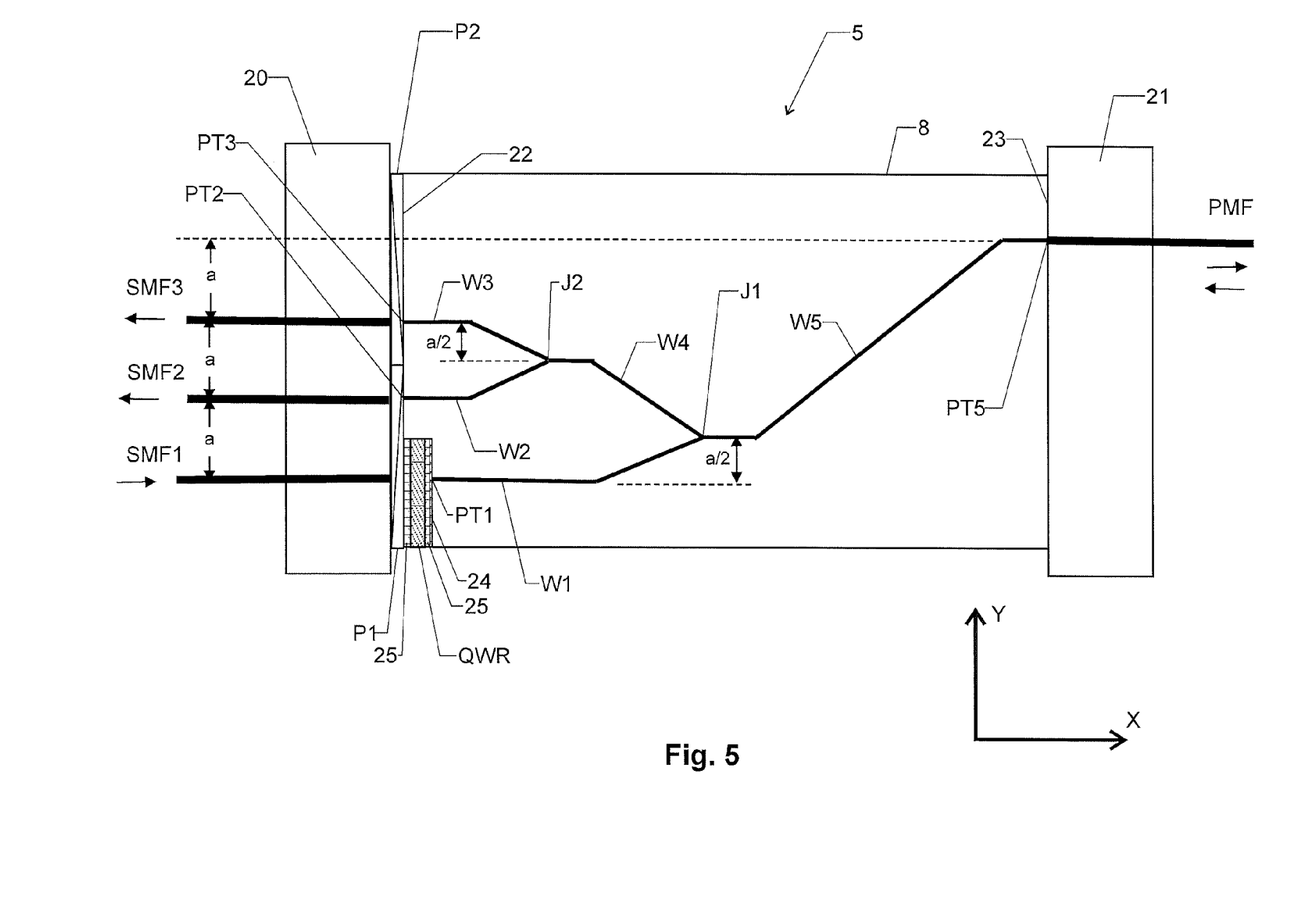
FIG. 5 shows a further embodiment of a beam splitter.

Another splitter modification according to the present invention is shown in FIG. 5. The modification is largely equivalent to the one of FIG. 4, but sensing-side port PT5 is now moved towards the opposite edge of the chip of beam splitter 8, i.e. it is located (as seen along direction y) on the opposite side of quarter-wave retarder QWR. Again, sensing-side port PT5 is laterally displaced along direction y by a distance of at least a from the nearest port (PT3 in this case) at first facet 22. This modification has the advantage that the recess 24 for retarder QWR has less depth (along lateral direction Y). Therefore, more surface area at first facet 22 is provided for gluing fiber holder 20 to beam splitter 8 (assuming similar chip widths). A drawback is the larger lateral displacement of waveguide section W5 from junction J1 and therefore a longer splitter length along direction X, if the waveguide radii are kept the same.

Figure 6:
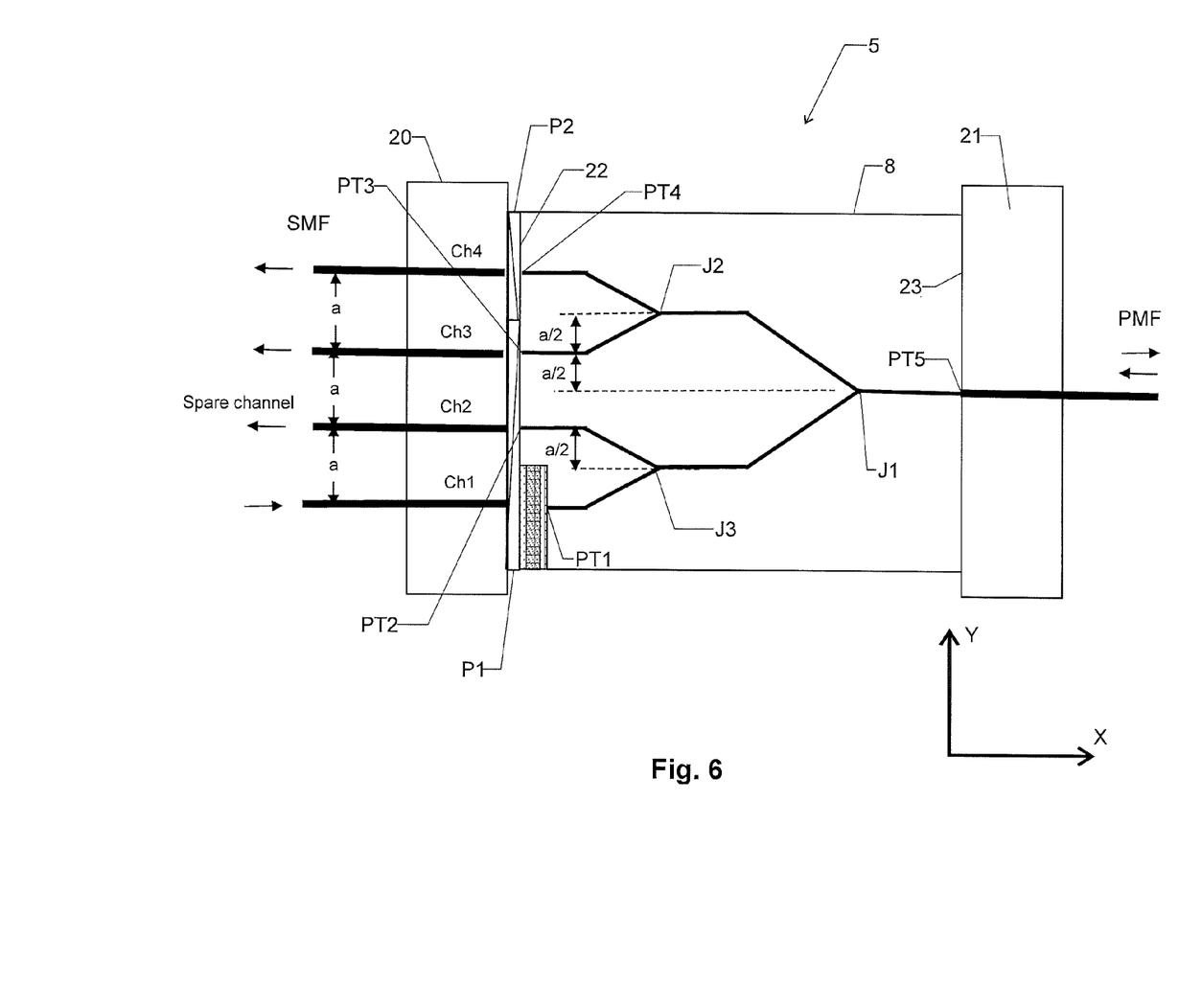
FIG. 6 shows a further embodiment of a beam splitter.

FIG. 6 shows a further beam splitter 8 according to the present invention. The modification comprises a conventional 1×4 PLC splitter, again supplemented with analyzer optics for use in a polarimetric current sensor. In this embodiment, there is one optoelectronics-side entry port PT1 and there are three opto-electronics-side exit ports PT2-PT4, while there is still only one sensing-side port PT5.

In this embodiment, beam splitter 8 comprises a first junction J1, a second junction J2 and a third junction J3. First junction J1 splits light from sensing-side port PT5 between the second and third junctions J2, J3, while second junction J2 splits light from first junction J1 between second optoelectronics-side exit port PT3 and a third optoelectronics-side exit port PT4. Third junction J3 splits light from first junction J1 between optoelectronics-side entry port PT1 and first optoelectronics-side exit port PT2.

In contrast to a 1×3 PLC splitter chip (FIG. 2), the waveguide junctions J1, J2, J3 are symmetric (all with a splitting ratio of 1:1).

With the exception of junction J1, which is the one closest to the sensing-side port PT5, none of the junctions is in line with a waveguide-to-fiber port. (Junction J1 is in line with the PMF but not with any of the optoelectronics-side ports PT1, PT2, PT3, PT4). Hence, also the PMF is not in line with any of the SMFs of the detector channels. Therefore, the 1×4 polarization splitter also substantially reduces the influence of stray light in comparison to a state-of-the-art 1×3 polarization splitter. Note that the signals of channels 2 and 3 are equivalent. One of the two channels may serve as a spare channel. Alternatively, if polarizer P1 covers channels Ch1 and Ch2 and polarizer P2 covers channels Ch3 and Ch4, the signals of channels Ch3 and Ch4 are equivalent.

A small drawback of a 1×4 polarization splitter versus a 1×3 polarization splitter is, that for a given light source power the optical power arriving at the photo-detectors is lower by a (theoretical) factor of 1.74.

Instead of a 1×3 or 1×4 integrated-optics (polarization) splitter, an M×N integrated-optics (polarization) splitter (with M=1, 2, . . . , in particular M=1, and N=5, 6, 7, . . . ) can be employed. This allows to connect to at least two, in particular to at least four, optoelectronics-side exit ports to provide at least two redundant signals indicative of the measurand. These redundant signals are typically generated in at least two separate optoelectronics modules or sensor electronics units 1. For example, a 1×6 splitter can be prepared to provide two pairs of equivalent detector signals and one spare signal (or three pairs of equivalent detector signals, if one also makes use of the signal returning through the source channel fiber). This allows to operate one sensor head with several units of redundant signal processing electronics units 1 or to deliver the signals to electronics at different locations.

Figure 7:
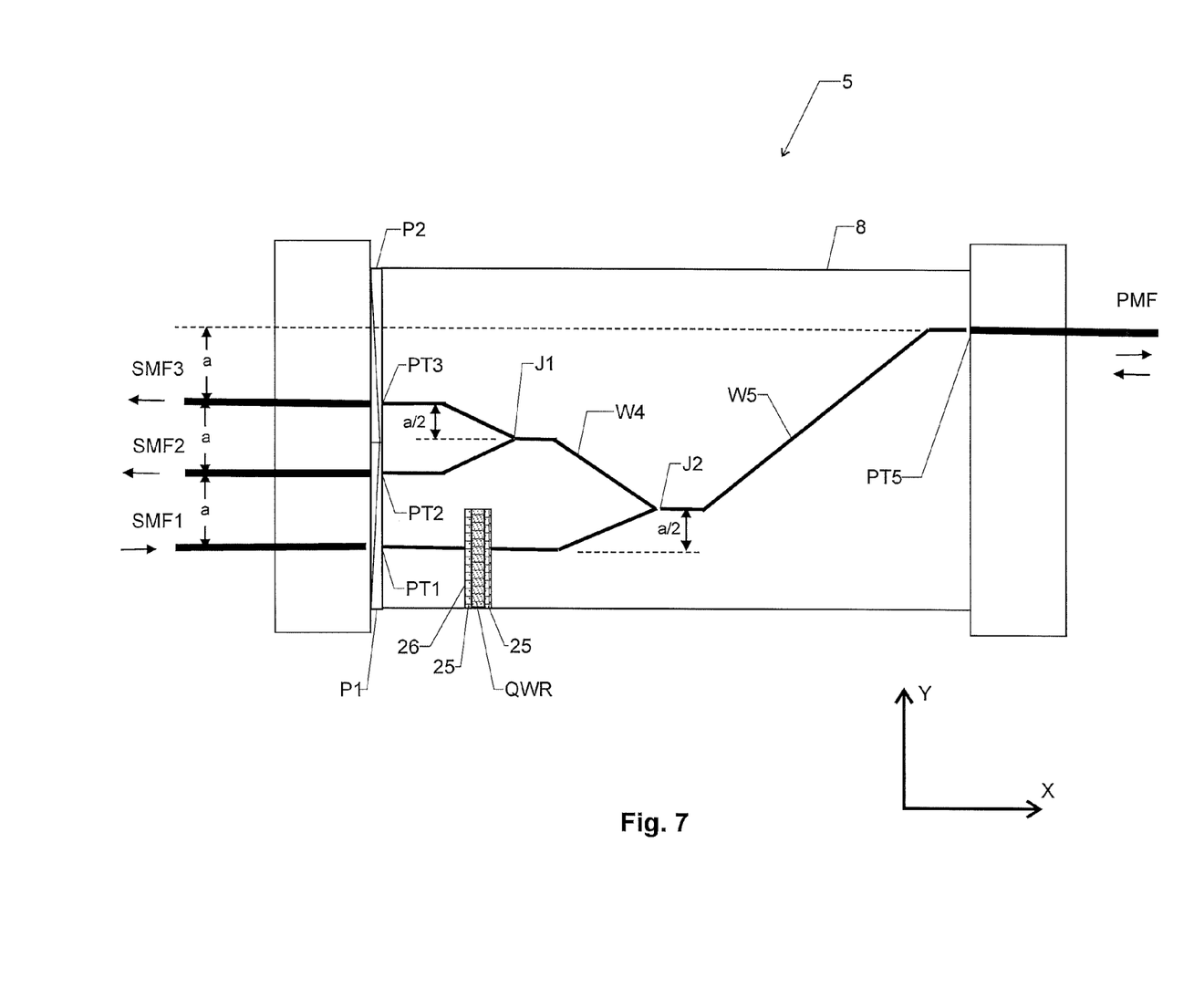
FIG. 7 shows a further embodiment of a beam splitter.

In principle, instead of placing quarter-wave retarder QWR into a recess 24 at first facet 22, beam splitter 8 may be equipped with a slit 26 for receiving the retarder QWR, as shown in FIG. 7. Retarder QWR is glued into slit 26, with a soft adhesive 25 on at least one side, advantageously on both sides. The thickness (in direction X) of each layer of adhesive is again advantageously at least 1 μm.

However, this arrangement is less preferred, because unguided light before the slit 26 can couple together with guided light into the waveguide after the slit and give again rise to undesired interference effects.

Performance

As explained in Ref. 5, in case of alternating current measurement one can utilize the variation of the phase bias versus temperature as a measure for the temperature at the location of the splitter and fiber coil. The phase bias follows from the low-pass filtered difference of the two detector signals divided by their sum (here called normalized DC offset).

In this context, "low-pass filtered" designates an average of the signals over a plurality of periods of a periodic measurand, such as of a periodic current or voltage signal.

Hence, one can compensate any residual temperature dependence of the sensor. It is obvious that an essentially stress-free retarder is a prerequisite for this method. Only the temperature-dependent natural birefringence of the retarder then determines the phase bias, but not stress-induced birefringence.

Figure 8:
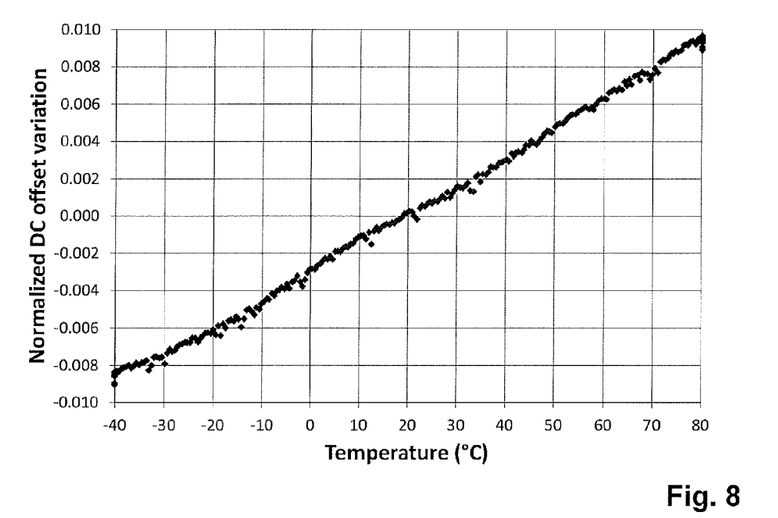
FIG. 8 shows the variation of the normalized DC offset as a function of the splitter temperature.

FIG. 8 shows the variation of the normalized DC offset of a sensor with a beam splitter 8 as described herein as a function of the beam splitter temperature. It is obvious that the DC offset (i.e. phase bias) varies linearly with temperature and is free from stress or other disturbing effects. The temperature can be derived from the DC offset with an accuracy of about ±5° C.

Hence, in more general terms, the sensor device can be used for determining the temperature at the quarter-wave plate QWR by measuring the difference between signals from the light detectors PD1, PD2 in the absence of a phase shift in said sensing element (e.g. for current or voltage zero in a current of voltage detector) or can be derived from low-pass filtered values of said signals over several periods of a periodic measurand.

Figure 9:
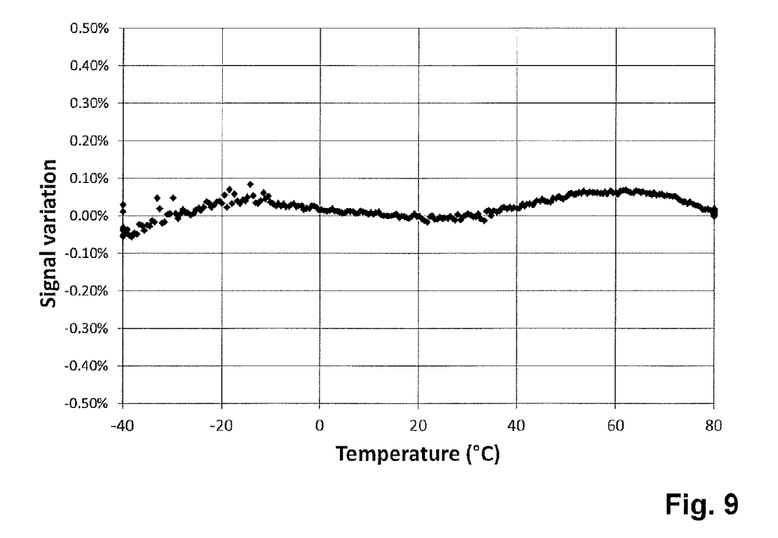
FIG. 9 shows the sensor signal as function of the splitter temperature at constant applied current after temperature compensation.

FIG. 9 shows the sensor signal as function of the splitter temperature at a constant applied current after temperature compensation. The signal variation is within <±0.1% over a temperature range from −40° C. to 80° C., i.e. the sensor is adequate for metering with class 0.2 accuracy. For comparison, signal disturbances of several tenths of a percent may occur for non-optimized beam splitters of the state of the art.

Benefits

As a result of the techniques described herein, the polarization beam splitter 8 (herein generally called splitter) can be exposed to an extended temperature range (e.g. from −40° C. to 85° C.). Therefore, the polarization beam splitter 8 does not need any temperature control [6] and can be placed together with the sensing fiber coil into a common housing (Note: The technique is of course also beneficial to splitters in a temperature-controlled environment). Some important advantages that result from this arrangement are as follows:

- The fiber link between the optoelectronics module (which is commonly located in the substation control house or a heated outdoor cubicle) and the fiber coil housing consists of standard single-mode fibers. (The short polarization-maintaining fiber section between the splitter and the coil is within the sensor head housing.) By contrast, a splitter that requires temperature control must be put into the optoelectronics module 1 or a separate enclosure on ground-potential somewhere between the optoelectronics module 1 and the fiber coil on high voltage. In this case, at least part of the fiber link is polarization-maintaining, which increases complexity and adds substantial cost.
- Furthermore, the absence of a polarization-maintaining link makes the sensor less prone to mechanical stress on the fiber. Such stress can occur, e.g., at fiber connectors (if any) or fiber feedthroughs, if the sensor is integrated, e.g., into a circuit breaker [12,13] or high voltage insulator.
- The fiber link can have standard single-mode fiber connectors and does not need demanding and expensive polarization maintaining connectors.
- Also, a standard fiber link can be much longer than a polarization-maintaining link; >10 km versus <500 m.
- The option to use long fiber cables enables current measurement at remote locations with no electrical power supply nearby. A corresponding application is "mixed line protection". Here, current is measured at the transition from overhead powerline to an underground power cable. Such locations can be many kilometers away from the nearest substation.

Notes

As mentioned above, the waveguides in beam splitter 8 may be birefringent with the magnitude of birefringence depending on the fabrication procedures. For example, the single pass phase retardation may correspond to 150 degrees for a splitter with a length of 10 mm. Highly birefringent waveguides may be fabricated by giving the waveguides an elliptical shape. In this case the birefringence on the forward and return paths may be chosen differently (by adequately designing the mask for the waveguide fabrication) such that the difference corresponds to 90° (or 90°+n·180°, n=1, 2, 3, . . . ), with a tolerance of, e.g., +/−10°, in particular +/−5°. The extra quarter-wave retarder for introducing the phase bias could then be avoided.

In more general terms, the waveguide sections of the beam splitter 8 are advantageously birefringent and introduce a phase shift of 90°+n·180°, with n being zero or a positive integer, between the two polarization modes of light passing from the optoelectronics-side entry port PT1 to the sensing-side port PT5 and returning back with swapped polarization directions to one of the optoelectronics-side exit ports PT2-PT4.

In case of birefringent waveguides, the (missing) birefringence of the recess results in an extra (temperature-dependent) contribution to the phase bias of the orthogonal light waves. Depending on the relative orientation of the slow axis of the retarder and the waveguides, the extra contribution adds to or subtracts from the retardation of the retarder. This can be utilized to enhance or reduce the temperature-dependence of the phase bias.

The improvements of the splitter according to present invention include both a new waveguide layout for the suppression of stray light and a recess or slit in the beam splitter for stress-free retarder mounting. As a matter of principle, polarization beam splitters (or briefly beam splitters or splitters) are also conceivable where only one of the two measures is implemented.

As mentioned in Ref. 6, the end facets 22, 23 of the splitter may be angle-polished (e.g. at 8° with respect to the waveguide plane normal) to reduce back reflections. This may apply to only one facet (e.g. the PMF facet) or both facets.

Beam splitter 8 comprises a substrate and the waveguide sections and junctions integrated thereon.

Typically, the splitter substrate consists of glass. But also splitters based on polymer [14, 15] or crystalline substrates, for example Si or InP [16,17], are conceivable.

As an alternative to ion exchange, the waveguides of the splitter may also be produced by direct laser-writing [18] or silicon-on-insulator (SOI) technology.

The thin film polarizers may have an active side (or surface) where the polarizing particles are concentrated. In this case, the active side advantageously faces beam splitter 8. Hence, possible birefringence in the bulk of the polarizer platelets (e.g. from gluing) cannot affect the phase difference between the two orthogonal polarization modes.

In more general terms, if the polarizers have a first side that has stronger anisotropic (polarization-dependent) absorption than a second side, the first side should advantageously face beam splitter 8.

Instead of the single-mode fibers SMF 2 and SMF 3, multimode fibers may be used. Due the larger core size (for example 62.5 µm instead of the 9-µm-core of a SMF) the coupling losses from the SC waveguides into the fibers are reduced.

Figure 10:
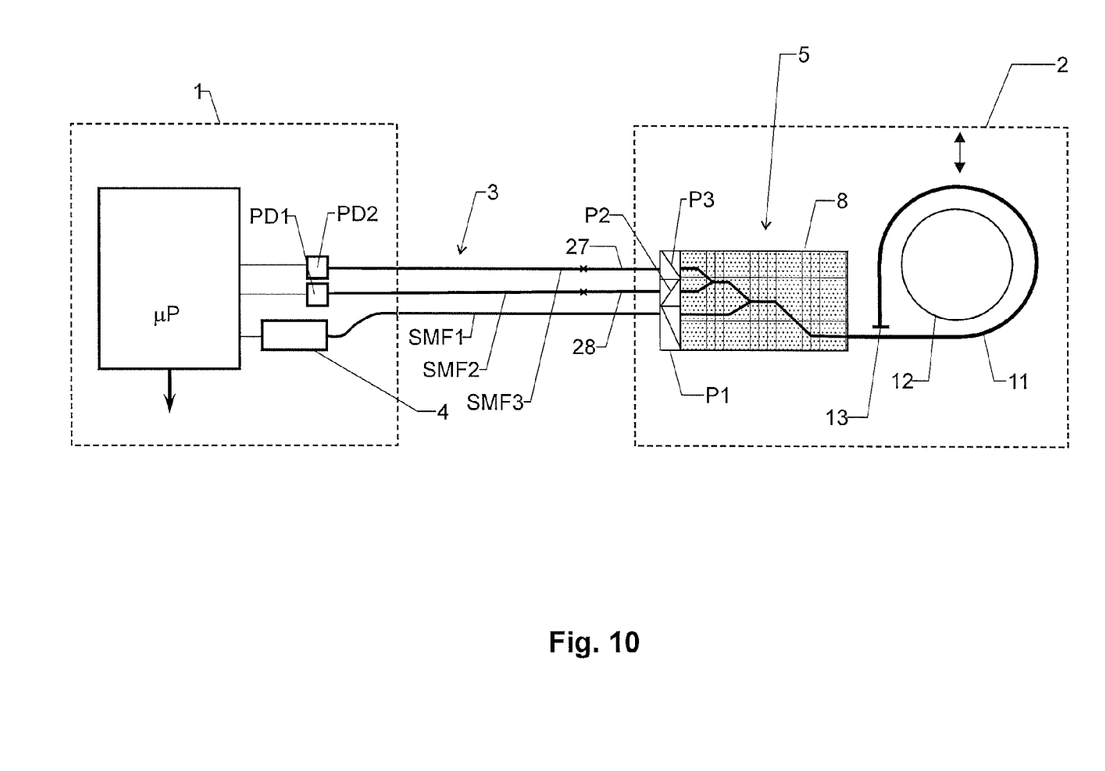
FIG. 10 shows an alternative sensor device.

Advantageously, there are Lyot-type fiber depolarizers in the two detector channels after the polarizers P1, P2 in order to avoid polarization dependent loss on the path to the photodetectors. Such loss could increase the sensitivity to mechanical perturbations of the fibers. Lyot-type fiber depolarizers consist of two PMF sections with their slow axes at 90° and a length ratio of 2:1. Instead of a Lyot fiber depolarizer one can use only a single PMF-section (i.e. a birefringent fiber) in each detector channel that is pigtailed to the beam splitter device 5 with a principal axis at 45° (with tolerances +/−10°, in particular +/−5°) to the polarization directions of polarizers P1, P2. The length of the PMF-section is chosen such that the birefringent group delay is larger than the coherence length of the light source. Typically, a fiber section with a length of at least 10 cm, in particular of at least 20 cm, meets this requirement. A corresponding set of birefringent fibers 27, 28 is shown in FIG. 10.

It should be noted that the invention is not only applicable to the sensor configuration described above, but to various modifications. FIG. 10 shows a sensor version that works with linearly polarized light instead of two (incoherent) circularly polarized light waves in the fiber coil. Both the polarization splitter and fiber coil are without a quarter-wave retarder. It is assumed that the waveguides of the splitter are free of birefringence. Polarizer P1 polarizes the light from the source. The polarized light makes a roundtrip through the fiber coil and returns to the detector channel polarizers P2, P3. Polarizers P2, P3 are aligned at ±45° to P1. The sensing fiber is directly pigtailed to the polarization splitter. The two detector signals S1, S2 are again given by eq. 1, 2 with the difference, that the term $\Delta\phi$ is now the angle by which the polarization is rotated in the fiber coil as a result of the Faraday effect: $\Delta\phi=2VNI$. The reflector is like before simply a reflective coating on the fiber end. Alternatively, the reflector may be a 45°-Faraday rotator mirror. A double pass of the light through the device rotates the polarization by 90°. Disturbing linear birefringence in the sensing fiber, e.g. at the fiber holder of the splitter, is then at least partly compensated.

In another sensor version, the light returning to the polarization splitter may be split into three detector channels. The polarizer of the 3rd channel is parallel to the polarizer of the source channel. The 3rd channel serves as a measure for the fringe contrast, as disclosed in Ref. 5.

Further, it should be noted that the polarization splitter is not only suited for use in an optical current sensor, but may be used in other types of sensors, where the measurand produces a differential phase shift between orthogonal polarization modes. An example is an optical voltage sensor as disclosed in Ref. 6, where a voltage applied to an electro-optic crystal generates the differential phase shift.

In the embodiments above, the offset between the used optoelectronics-side ports and the sensing-side port is along direction Y. However, for a beam splitter whose waveguide segments are arranged in three dimensions, and not just in a single plane, the offset can also be along a direction perpendicular to the surface of the beam splitter. This also applies to the offsets between the waveguide junctions and the optoelectronics-side ports and the sensing-side port.

While there are shown and described presently preferred embodiments of the invention, it is to be distinctly understood that the invention is not limited thereto, but may be otherwise variously embodied and practiced within the scope of the following claims.

REFERENCES CITED

1. G. Frosio and R. Dändliker, "Reciprocal reflection interferometer for a fiber-optic Faraday current sensor"; Appl. Opt. 33(25), 6111-6122, 1994.

2. K. Bohnert, P. Gabus, J. Nehring, and H. Brändle, "Temperature and vibration insensitive fiber-optic current sensor," Journal of Lightwave Technology, Vol. 20, pp. 267-276, 2002.
3. K. Bohnert, P. Gabus, J. Nehring, H. Brändle, and M. G. Brunzel, "Fiber-optic current sensor for electro-winning of metals", J. Lightw. Technol. 25(11), 3602, 2007.
4. "The fiber-optic gyroscope", Herve Lefevre, Artech House, Boston, London, 1993.
5. WO2007/121592A1, "Fiber-optic current sensor with polarimetric detection scheme". Inventors: K. Bohnert, A. Frank, H. Brändle.
6. WO2015/090448A1, "Optical sensors". Inventors: K. Bohnert, A. Frank, G. Müller, L. Yang.
7. K. Kurosawa at al., "Flexible fiber Faraday effect current sensor using flint glass fiber and reflection scheme", IEICE Trans. Electron. E83C, 326, 2000.
8. WO2014/006121, "Temperature-compensated fiber-optic current sensor". Inventors: G. Müller, A. Frank, K. Bohnert, X. Gu.
9. Standard of the International Electrotechnical Comission (IEC), IEC60044-8, Instrument transformers—Part 8: Electronic current transformers.
10. K. Forest et al., "Channel waveguide in glass via silver-sodium field assisted ion exchange", J. Lightw. Technol. Lt-4 (2), 140, 1986.
11. M. Izutsu et al., "Operation mechanism of the single-mode optical waveguide y-junction", Opt. Lett. 7(3), 136, 1982.
12. WO2008/080878A1, Inventors: U. Akesson, D. Andersson, L. Sköld, Y. Petersson, "Circuit breaker".
13. U.S. Pat. No. 6,608,481B1, Inventors: C. Piazza, E. Centenaro, K. Bohnert, P. Gabus, H. Brändle, R. Cameroni, "Pole of a circuit breaker with an integrated optical current sensor".
14. V. Prajzler et al., "Design and modeling of symmetric three branch polymer planar optical power dividers", Radioengineering 22(1), 233, 2013.
15. M.-C. Oh, et al., "Polymer waveguide integrated-optic current transducers", Opt. Express 19(10), 9392, 2011.
16. Y. Xu, "Proposal for compact polarization splitter using asymmetrical three-guide directional coupler", IEEE Photon. Technol. Lett. 27(7), 782, 2015.
17. L. Han et al., "A high extinction ratio polarization beam splitter with MMI couplers on InP substrate", IEEE Photon. Technol. Lett. 27(7), 782, 2015.
18. M. Beresna, M. Gecevicius, and P. G. Kazansky, "Ultrafast laser direct writing and nanostructuring in transparent materials", Advances in Optics and Photonics 6, 293-339 (2014).

LIST OF REFERENCE NUMBERS

1: sensor electronics unit/optoelectronics module
2: sensor head
3: fibers
4: light source
5: beam splitter device
7: spacer
8: integrated-optical beam splitter
9: PMF pigtail
10: retarder
11: sensing fiber
12: conductor
13: reflector
14: central waveguide
15, 16: outer waveguides
17, 18: y-junctions
19: core regions of stray light
20, 21: fiber holder
22, 23: first and second facet
24: recess
25: adhesive
26: slit
27, 28: birefringent fibers
a: fiber spacing
Ch1 . . . Ch4: channels
J1, J2, J3: junctions
P1, P2: polarizers
PD1, PD2: photodetectors
PT1, PT2, PT3, PT5: ports
QWR: quarter-wave retarder
SMF 1, SMF 2, SMF3: single mode fibers
W1, W2 . . . : waveguide sections

The invention claimed is:

1. An optical sensor device comprising:
   a light source,
   a first fiber, wherein light from said light source is coupled into said first fiber,
   an integrated-optics beam splitter having an optoelectronics-side entry port, a first and a second optoelectronics-side exit port and a sensing-side port, wherein light entering said optoelectronics-side entry port is coupled at least partially into said sensing-side port and light entering said sensing-side port is split at least partially into said first and second optoelectronics-side exit ports, and wherein said first fiber is positioned to send light into said optoelectronics-side entry port,
   a sensing element whose birefringence changes as a function of a measurand, wherein light from said sensing-side port is coupled into said sensing element, is reflected and is coupled back into said sensing-side port,
   at least a second fiber and a third fiber, wherein light from said first and said second optoelectronics-side exit ports is fed into said second and third fibers, respectively,
   light detectors for measuring light exiting from said second and third fibers,
   wherein said beam splitter comprises
   a) a plurality of waveguide sections and splitting junctions, and
   b) a first and a second facet on opposite sides of said integrated-optics beam splitter, wherein said optoelectronics-side entry port and said optoelectronics-side exit ports are arranged at said first facet and said sensing-side port is arranged at said second facet,
   wherein, in a direction Y parallel to said first facet, said sensing-side port is offset, by a non-zero minimum port-port-offset, in respect to said optoelectronics-side entry port and said first and second optoelectronics-side exit ports,
   wherein in said direction Y, said sensing-side port is offset, by a non-zero minimum junction-port-offset, in respect to any junction that the light from said optoelectronics-side entry port passes on its way to said sensing-side port.

2. The sensor device of claim 1, wherein said integrated-optics beam splitter has, in a direction perpendicular to said first facet, a length of L, and wherein said minimum port-port offset is at least L/20.

3. The sensor device of claim 1, wherein said minimum port-port-offset is at least 250 µm.

4. The sensor device of claim 1, wherein, in said direction Y, said first and second optoelectronics-side exit ports are offset, by a non-zero minimum junction-port-offset, in respect to any junction that the light from said sensing-side port passes on its way to any of said optoelectronics-side entry or exit ports.

5. The sensor device of claim 4, wherein said minimum junction-port-offset is at least D/20, in particular at least D/10, with D being the farthest distance of any of said junctions to any of said facets.

6. The sensor device of claim 4, wherein said minimum junction-port-offset is at least 125 µm.

7. The sensor device of claim 1, wherein said waveguide sections are birefringent and introduce a phase shift of $90°+n·180°$, with n being zero or a positive integer, between two polarization modes of light passing from said optoelectronics-side entry port to said sensing-side port and, with swapped polarizations, back to one of said optoelectronics-side exit ports.

8. The sensor device of claim 1, comprising:
a quarter-wave retarder arranged between at least one of said fibers and sensing-side port,
wherein said beam splitter comprises a recess or slit, wherein said quarter-wave retarder is arranged in said recess or a width of said slit, respectively, is larger than a width of said quarter-wave retarder.

9. The sensor device of claim 8, wherein an input side and/or an output side of said quarter-wave retarder is bordering a transparent adhesive layer of a thickness of at least 5 µm and a Young's modulus of said adhesive layer is at least smaller by a factor of 10 than a Young's modulus of said quarter-wave retarder.

10. The sensor device of claim 9, wherein said adhesive layer is a silicone, an acrylate, a urethane acrylate, or an adhesive layer with a glass transition temperature below −40° C.

11. The sensor device of claim 1, comprising at least a first and a second polarizer arranged between said fibers and said optoelectronics-side entry port and said optoelectronics-side exit ports.

12. The sensor device of claim 8, wherein said quarter-wave retarder is arranged in the recess between at least one of said polarizers and said integrated-optics beam splitter.

13. The sensor device of claim 11, wherein said polarizers have a first side having stronger anisotropic absorption than a second side, and wherein said polarizers are arranged with said first side facing said integrated-optics beam splitter.

14. The sensor device of claim 11, further comprising first and a second birefingent fibers arranged between said second and said third fibers and said integrated-optics beam splitter, wherein said birefingent fibers are arranged with principal axes under 45° in respect to a polarization direction of said polarizers, and wherein a birefringent group delay of said birefringent fibers is larger than a coherence length of the light source.

15. The sensor device of claim 1, wherein said sensing element comprises a magneto-optic component or an electro-optic component, and said sensor device is adapted to measure a current or voltage.

16. The sensor device of claim 1, wherein said integrated-optics beam splitter comprises a first junction and a second junction, wherein said first junction splits light from said sensing-side port between said optoelectronics-side entry port and said second junction, and wherein said second junction splits light from said first junction between said first optoelectronics-side exit port and said second optoelectronics-side exit port.

17. The sensor device of claim 16, wherein, along said direction Y,
said first junction is arranged between said optoelectronics-side entry port and said first optoelectronics-side exit port and/or
said second junction is arranged between said first and said second optoelectronics-side exit ports.

18. The sensor device of claim 8, wherein said quarter-wave retarder is arranged between said first fiber and said first junction.

19. The sensor device of claim 1, wherein said beam splitter comprises a first junction, a second junction and a third junction, wherein said first junction splits light from said sensing-side port between said second and third junctions, and wherein said second junction splits light from said first junction between said second optoelectronics-side exit port and a third optoelectronics-side exit port, and wherein said third junction splits light from said first junction between said optoelectronics-side entry port and said first optoelectronics-side exit port.

20. The sensor device of claim 1, wherein an M×N integrated-optics splitter with integers M=1, 2, . . . and N=5, 6, 7, . . . is used and provides at least two, in particular at least four, optoelectronics-side exit ports for being connected to two separate sensor electronics units which generate at least two redundant signals indicative of the measurand.

21. Use of the sensor device of claim 1 for determining a temperature at said quarter-wave retarder or for correcting said measurand by measuring a difference between normalized signals from said light detectors, wherein said difference is measured in the absence of a phase shift in said sensing element or is derived from low-pass filtered values of said signals over several periods of a periodic measurand.

* * * * *